United States Patent
Gelatos et al.

(10) Patent No.: US 9,230,835 B2
(45) Date of Patent: Jan. 5, 2016

(54) INTEGRATED PLATFORM FOR FABRICATING N-TYPE METAL OXIDE SEMICONDUCTOR (NMOS) DEVICES

(71) Applicant: Applied Materials, Inc., Santa Clara, CA (US)

(72) Inventors: Avgerinos V. Gelatos, Redwood City, CA (US); Srinivas Gandikota, Santa Clara, CA (US); Seshadri Ganguli, Sunnyvale, CA (US); Xinyu Fu, Pleasanton, CA (US); Bo Zheng, Saratoga, CA (US); Yu Lei, Foster City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/211,156

(22) Filed: Mar. 14, 2014

(65) Prior Publication Data

US 2014/0273515 A1    Sep. 18, 2014

Related U.S. Application Data

(60) Provisional application No. 61/792,675, filed on Mar. 15, 2013.

(51) Int. Cl.
| | |
|---|---|
| *H01L 21/31* | (2006.01) |
| *H01L 21/67* | (2006.01) |
| *H01L 21/285* | (2006.01) |
| *H01L 21/28* | (2006.01) |
| *H01L 29/49* | (2006.01) |

(52) U.S. Cl.
CPC .......... *H01L 21/6723* (2013.01); *H01L 21/285* (2013.01); *H01L 21/28079* (2013.01); *H01L 21/28088* (2013.01); *H01L 21/28525* (2013.01); *H01L 21/28568* (2013.01); *H01L 21/6719* (2013.01); *H01L 21/67207* (2013.01); *H01L 29/4958* (2013.01); *H01L 29/4966* (2013.01)

(58) Field of Classification Search
USPC .......................................... 438/763
See application file for complete search history.

(56) References Cited

U.S. PATENT DOCUMENTS

| | | | | |
|---|---|---|---|---|
| 6,069,047 | A * | 5/2000 | Wanlass ........................ | 438/305 |
| 7,611,990 | B2 * | 11/2009 | Yoon et al. .................... | 438/680 |
| 2006/0246640 | A1 * | 11/2006 | Kuwashima et al. ......... | 438/151 |

OTHER PUBLICATIONS

Zhu et al., "Low-Resistance Titanium/N-Type Silicon (100) Contacts by Monolayer Selenium Passivation," J. Phys. D: Appl. Phys. 40 (2007), 547-550.

(Continued)

*Primary Examiner* — Reema Patel
*Assistant Examiner* — Syed Gheyas
(74) *Attorney, Agent, or Firm* — Moser Taboada; Alan Taboada (57) ABSTRACT

Embodiments of an integrated platform for fabricating n-type metal oxide semiconductor (NMOS) devices are provided herein. In some embodiments, an integrated platform for fabricating n-type metal oxide semiconductor (NMOS) devices may include a first deposition chamber configured to deposit a first layer atop the substrate, the first layer comprising titanium oxide ($TiO_2$) or selenium (Se); a second deposition chamber configured to deposit a second layer atop the first layer, the second layer comprising titanium; a third deposition chamber configured to deposit a third layer atop the second layer, the third layer comprising one of titanium nitride (TiN) or tungsten nitride (WN).

20 Claims, 4 Drawing Sheets

(56) References Cited

OTHER PUBLICATIONS

Wong, et al., "Novel Nickel Silicide Contact Technology Using Selenium Segregation for SOI N-FETs With Silicon-Carbon Source/Drain Stressors," IEEE Electron Device Letters, vol. 29, No. 8, Aug. 2008, 841-844.

Wong, et al., "Effective Schottky Barrier Height Reduction Using Sulfur or Selenium at the NiSi/n-Si (100) Interface for Low Resistance Contacts," IEEE Electron Device Letters, vol. 28, No. 12, Dec. 2007, 1102-1104.

Agrawal, et al., "A Unified Model for Insulator Selection to Form Ultra-Low Resistivity Metal-Insulator-Semiconductor Contacts to n-Si, n-Ge, and n-InGaAs," Applied Physics Letters 101, 042108 (2012).

Paramahans, et al., "ZnO: An Attractive Option for N-Type Metal-Interfacial Layer-Semiconductor (Si, Ge, SiC) Contacts," 2012 Symposium on VLSI Technology, Jun. 12-14, 2012.

Cross et al., "CMOS Band-Edge Schottky Barrier Heights Using Dielectric-Dipole Mitigated (DDM) Metal/Si for Source/Drain Contact Resistance Reduction," 2009 Symposium on VLSI Technology Digest of Technical Papers, 104-105.

\* cited by examiner

INTEGRATED PLATFORM FOR FABRICATING N-TYPE METAL OXIDE SEMICONDUCTOR (NMOS) DEVICES

CROSS-REFERENCE TO RELATED APPLICATIONS

This application claims benefit of U.S. provisional patent application Ser. No. 61/792,675, filed Mar. 15, 2013, which is herein incorporated by reference in its entirety.

FIELD

Embodiments of the present disclosure generally relate to semiconductor fabrication equipment.

BACKGROUND

As the technology node for semiconductor devices continues to shrink, for example to 20 nm and below, various schemes are being investigated to replace the nickel platinum silicide scheme currently used at up to the 20 nm node. Many of the new schemes under investigation require the use of many separate fabrication tools for the realization of the contacting scheme. However, the inventors have observed that the use of separate process chambers each configured to perform one or more processes (e.g., layer deposition, etching, annealing, or the like) required for the fabrication of the completed device can lead to undesired exposure of the device to an uncontrolled environment outside of the process chambers. Such exposure may contaminate the device or cause unintended reactions with portions of the device (e.g., oxidation of layers), thereby adversely affecting the characteristics of the completed device.

Therefore, the inventors have provided an improved integrated platform for fabricating n-type metal oxide semiconductor (NMOS) devices.

SUMMARY

Embodiments of an integrated platform for fabricating n-type metal oxide semiconductor (NMOS) devices are provided herein. In some embodiments, an integrated platform for fabricating n-type metal oxide semiconductor (NMOS) devices may include a first deposition chamber configured to deposit a first layer atop the substrate, the first layer comprising titanium oxide ($TiO_2$) or selenium (Se); a second deposition chamber configured to deposit a second layer atop the first layer, the second layer comprising titanium; a third deposition chamber configured to deposit a third layer atop the second layer, the third layer comprising one of titanium nitride (TiN) or tungsten nitride (WN).

In some embodiments, an integrated platform for fabricating n-type metal oxide semiconductor (NMOS) devices may include a transfer chamber having a substrate transfer robot disposed within the transfer chamber, the transfer chamber having a plurality of process chambers coupled to the transfer chamber, the plurality of process chambers comprising: a first deposition chamber configured to deposit a first layer atop the substrate, the first layer comprising titanium oxide ($TiO_2$) or selenium (Se); a second deposition chamber configured to deposit a second layer atop the first layer, the second layer comprising titanium; a third deposition chamber configured to deposit a third layer atop the second layer, the third layer comprising one of titanium nitride (TiN) or tungsten nitride (WN); a load-lock chamber coupled to the transfer chamber; and a factory interface having a substrate transfer robot disposed within the factory interface, the factory interface coupled to the transfer chamber to provide the substrate to the integrated platform.

In some embodiments, a method for fabricating n-type metal oxide semiconductor (NMOS) devices may include depositing, in a first deposition chamber, a first layer on a top processing surface of a substrate, the first layer comprising titanium oxide (TiO2) or selenium (Se), depositing, in a second deposition chamber, a second layer atop the first layer, the second layer comprising titanium; and depositing, in a third deposition chamber, a third layer atop the second layer, the third layer comprising one of titanium nitride (TiN) or tungsten nitride (WN).

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of an integrated platform for fabricating n-type metal oxide semiconductor (NMOS) devices are provided herein. In at least some embodiments, the inventive integrated device may advantageously fabricate an NMOS device in one or more process chambers of a single integrated platform, thereby providing an increased level of control over the fabrication environment, as compared to fabricating the NMOS device in separate standalone process chambers. The inventive integrated platform may be used to fabricate n-type metal oxide semiconductor devices having advanced NMOS junctions, for example such as 14 nm nodes and below.

Figure 1:
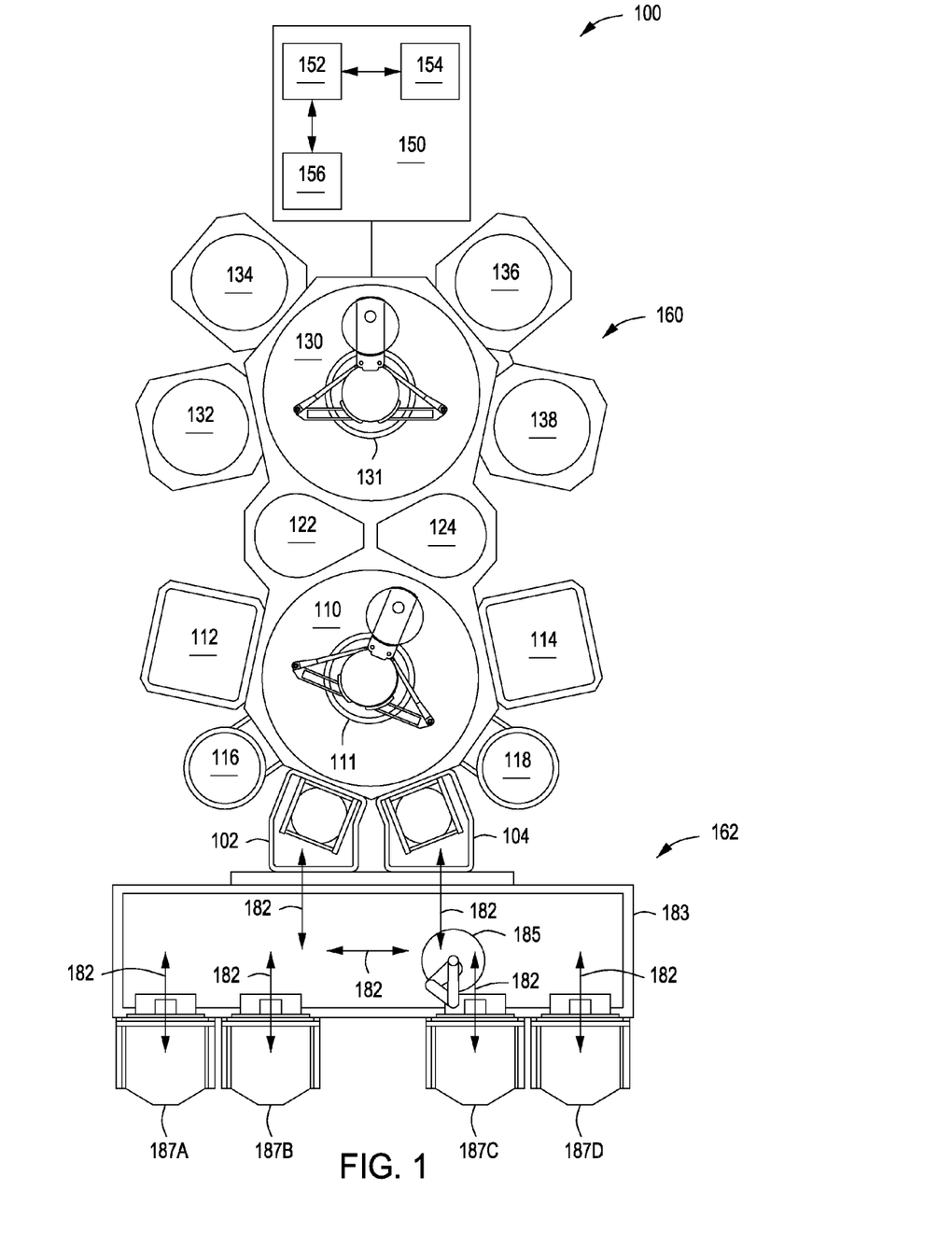
FIG. 1 depicts a schematic view of an integrated platform in accordance with some embodiments of the present disclosure.

FIG. 1 is a schematic view of an integrated platform in accordance with some embodiments of the present disclosure. An example of a suitable integrated platform (e.g., multi-chamber processing systems) suitable for modification in accordance with embodiments of the present disclosure include the ENDURA® mainframe, commercially available from Applied Materials, Inc of Santa Clara, Calif. It is contemplated that other processing systems, including those from other manufacturers, may also be modified in accordance with the present disclosure.

In some embodiments, the integrated platform 100 (e.g., a cluster tool or multi-chamber processing system) may generally comprise a vacuum-tight processing platform 160, a factory interface 162, and a controller 150. The processing platform 160 may include a plurality of process chambers (e.g., process chambers 112, 114, 116, 118, 132, 134, 136, and 138 shown in FIG. 1) and at least one transfer chamber (two transfer chambers 110, 130 shown in FIG. 1). In embodiments where two transfer chambers are provided, at least one pass-through chamber (two pass-through chambers 122, 124 shown in FIG. 1) are provided to facilitate passing the substrate between transfer chambers (e.g., 110 and 130). At least one load-lock chamber (two load lock chambers 102, 104 shown in FIG. 1) are provided to transfer substrates into and out of the integrated platform 100. Since the integrated platform 100 is operated under vacuum, the load lock chambers 102, 104 may be "pumped down" to maintain to facilitate entry and egress of substrates to the integrated platform 100.

In some embodiments, a first robot 111 may transfer substrates to or from the load lock chambers 102, 104, one or more pass-through chambers 122 and 124 and a first set of process chambers 112, 114, 116, 118. In some embodiments, the pass-through chambers 122 and 124 are used to maintain ultrahigh vacuum conditions while allowing substrates to be transferred within the integrated platform 100. In some embodiments, a second robot 131 may transfer substrates between the pass-through chambers 122 and 124 and a second set of process chambers 132, 134, 136 and 138.

Figure 2:
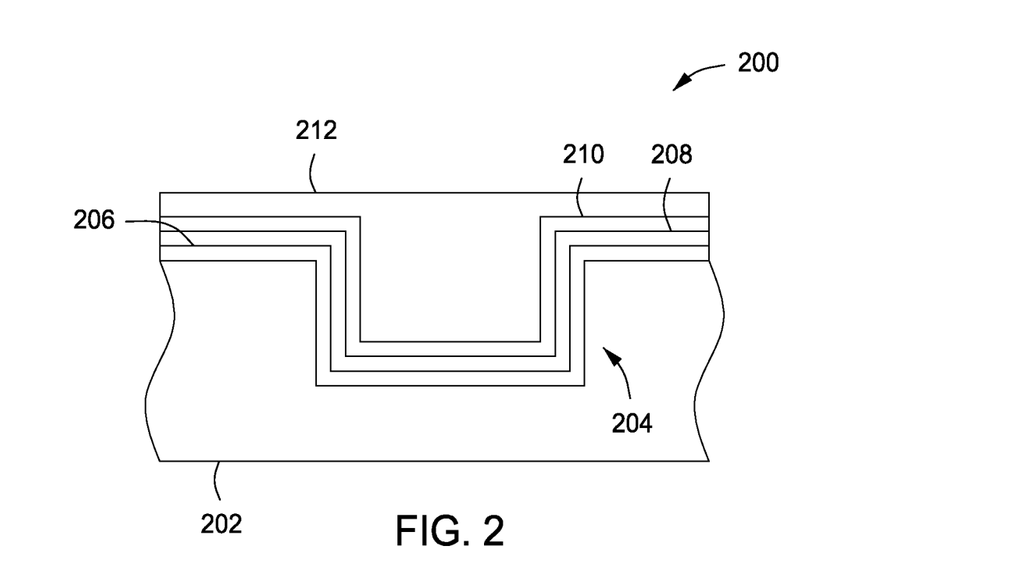
FIG. 2 depicts a partial side view of an NMOS device fabricated utilizing an integrated platform in accordance with some embodiments of the present disclosure.

The process chambers 112, 114, 116, 118, 132, 134, 136, 138 are configured in a manner suitable to facilitate the performance of the NMOS semiconductor substrate fabrication process as described herein. Referring to FIG. 2, for example, in embodiments where the process chambers 112, 114, 116, 118, 132, 134, 136, 138 are configured to form an NMOS device 200, the substrate 202 may be any suitable p-type substrate, such as a silicon substrate, a III-V compound substrate, a silicon germanium (SiGe) substrate, an epi-substrate, a silicon-on-insulator (SOI) substrate, or the like. In some embodiments, the substrate 202 may be a semiconductor wafer (e.g., a 200 mm, 300 mm, or the like silicon wafer). In some embodiments, the substrate 202 may include additional layers, for example one or more dielectric layers (not shown). In some embodiments, the substrate 202 may comprise one or more features 204 (e.g., trench, via, or the like) formed in the substrate 202 to facilitate forming a well (e.g., source or drain region) for the finished NMOS device.

The completed or partially completed NMOS device 200 may comprise any number of layers needed to form a complete NMOS device 200. For example, in some embodiments, the NMOS device 200 may comprise four layers (layers 206, 208, 210, 212 shown) disposed atop the substrate 202, as shown in FIG. 2.

The layers may comprise any materials suitable to form at least a portion of a completed NMOS device 200. For example, in some embodiments, a first layer (e.g., layer 206) disposed on the substrate 202 may comprise a titanium containing material, such as titanium oxide ($TiO_2$) or the like, or in some embodiments, a selenium (Se) containing material, for example such as Se, or selenium-silicon (SeSi), silicon selenide ($SiSe_2$), selenium carbide (SeC), selenoim silicon carbide (SeSiC), or the like. The inventors have observed that the use of a titanium or selenium containing material as the first layer in the fabrication of the NMOS device 200 may advantageously de-pin the Fermi level of the NMOS device 200 at a metal-semiconductor interface (e.g., interface between a metal containing layer, such as layer 212 described below and the substrate 202), allowing the use of n-type work function metals in the fabrication of the completed NMOS device 200 to provide an easy conduction of electrons into the substrate 202, thereby reducing metal-junction resistance of the NMOS device 200. In addition, the inventors have observed that the use of a titanium or a selenium containing material may further advantageously facilitate the conduction of electrons into the substrate 202 by reducing a contact resistance between the metal (e.g., layer 212) and the substrate 202.

In some embodiments, a second layer (e.g., layer 208), disposed atop the first layer, may comprise a titanium (Ti) containing material, for example, such as Ti, titanium nitride (TiN), titanium tetrachloride ($TiCl_4$), or the like, or may comprise a tantalum (Ta) containing material, for example, such as Ta, tantalum nitride (TiN), or the like. When present, the second layer functions as a capping layer in the NMOS device 200. In some embodiments, a third layer (e.g., layer 210) disposed atop the second layer may comprise a titanium or tungsten containing material, for example such a titanium nitride (TiN), titanium tetrachloride ($TiCl_4$), or the like, or tungsten nitride (WN), or the like. When present the third layer may function as a liner in the NMOS device 200. In some embodiments, a fourth layer (e.g., layer 212) disposed atop the third layer may comprise a metal, for example, such as aluminum (Al), copper (Cu), or the like. When present, the fourth layer may fill the feature 204 and function as a source and/or drain in the completed NMOS device 200.

In any of the above embodiments, the layers of the NMOS device 200 may be formed via any suitable processing method in any suitable process chamber, for example, such as the methods and process chambers discussed below. For example, referring back to FIG. 1, in some embodiments, the NMOS device (e.g., NMOS device 200 described above) may be fabricated in one or more process chambers of an integrated platform, for example such as the process chambers 112, 114, 116, 118, 132, 134, 136, 138 of the integrated platform 100. The inventors have observed that fabricating the NMOS device in one or more process chambers of a single integrated platform may provide an increased level of control over the fabrication environment, as compared to fabricating the NMOS device in separate standalone process chambers. For example, the inventors have observed that utilizing an integrated platform, the NMOS device may be moved between process chambers within the integrated platform, thereby reducing or eliminating changes in characteristics of the layers of the NMOS device cause by exposure to a non-controlled environment outside of the integrated platform.

In some embodiments, each of the process chambers 112, 114, 116, 118, 132, 134, 136, 138 may be configured to perform one or more processes to fabricate the NMOS device. For example, in some embodiments, a first process chamber (e.g., one of process chambers 116, 118) may be configured to perform a pre-cleaning process to eliminate contaminants and/or de-gas volatile gases from a substrate (e.g., substrate 202 described above) prior to transfer into another process chamber of the process chambers 112, 114, 116, 118, 132, 134, 136, 138 for processing. The first process chamber may be any type of process chamber suitable to perform a suitable pre-cleaning process, for example, such as the process chamber described below with respect to FIG. 3 and/or a process chamber that utilizes SICONI™ technology commercially available from Applied Materials, Inc., of Santa Clara, Calif. For example, in some embodiments, the first process chamber may be configured to provide a first plasma comprising hydrogen ($H_2$), nitrogen trifluoride ($NF_3$), and ammonia (NH$_3$) to the substrate to facilitate the pre-cleaning process. Alternatively, or in combination, in some embodiments, the first process chamber may be configured to provide a second plasma comprising hydrogen (H$_2$) or oxygen (O$_2$) to the substrate prior to, or in some embodiments, subsequent to the first plasma to facilitate the pre-cleaning cleaning process. In some embodiments, each of the first plasma and the second plasma may be provided from a remote source coupled to the process chamber.

A first deposition chamber (e.g., process chamber 132) is configured to perform a deposition process to deposit the first layer (e.g., layer 206) described above. In such embodiments, the first deposition chamber may be configured to perform any type of deposition process suitable to deposit the particular material being deposited (e.g., titanium, titanium oxide, or selenium).

For example, in embodiments where the first deposition chamber is configured to deposit a titanium containing material (e.g., such as the layer 206 described above) the first deposition chamber may be configured to perform a physical vapor deposition (PVD) process, for example, such as the process chamber configuration described below with respect to FIG. 4. In some embodiments, for example where the titanium containing material is titanium oxide (TiO$_2$), the first deposition chamber may be utilized to deposit a layer or titanium oxide (TiO$_2$), or, alternatively, a layer of titanium via a PVD process, followed by an oxidation of the titanium layer to form a titanium oxide (TiO$_2$) layer. In such embodiments, the titanium layer may be oxidized within the first deposition chamber by exposing the titanium layer to an oxygen containing gas or plasma. Alternatively, in some embodiments, the titanium may be oxidized outside of the first deposition chamber, for example such as during a transfer of the substrate (substrate 202) within the integrated platform 100 (i.e., in load lock chambers 102, 104), or in another process chamber (e.g., an oxidation chamber) of the process chambers 112, 114, 116, 118, 132, 134, 136, 138. In embodiments where the titanium layer is oxidized in another process chamber, the process chamber may be configured to perform a rapid thermal process (RTP). In some embodiments, the substrate may be returned to the first process chamber (e.g., the process chamber configured to perform a pre-cleaning process to oxidize the titanium layer described above).

In embodiments where the first deposition chamber is configured to deposit a selenium containing material (e.g., such as the layer 206 described above) the first deposition chamber may be configured to perform a chemical deposition process (e.g., (such as chemical vapor deposition (CVD), atomic layer deposition (ALD), or the like). In such embodiments, the first deposition chamber may be configured to provide hydrogen selenide (H$_2$Se) or a selenium containing metal-organic precursor to the substrate to form the selenium containing material. In some embodiments, the selenium may be activated via a post deposition annealing process. In such embodiments, the selenium layer may be annealed within the first deposition chamber. Alternatively, in some embodiments, the selenium layer may be annealed in another process chamber of the process chambers 112, 114, 116, 118, 132, 134, 136, 138. In embodiments where the selenium layer is annealed in another process chamber, the process chamber may be configured to perform a rapid thermal process (RTP). In some embodiments, the substrate may be returned to the first process chamber to anneal the selenium layer.

A second deposition chamber (e.g., process chamber 134) is configured to perform a deposition process to deposit the second layer (e.g., layer 208) described above. In such embodiments, the second deposition chamber may be configured to perform any type of deposition process suitable to deposit the particular material being deposited. For example, in embodiments where the second deposition chamber is configured to deposit a titanium containing capping layer (e.g., such as the layer 208 described above) the second deposition chamber may be configured to perform a physical vapor deposition (PVD) process, for example, such as the process chamber configuration described below with respect to FIG. 4.

A third deposition chamber (e.g., process chamber 136) is configured to perform a deposition process to deposit the third layer (e.g., layer 210) described above. In such embodiments, the third deposition chamber may be configured to perform any type of deposition process suitable to deposit the particular material being deposited. For example, in embodiments where the third deposition chamber is configured to deposit a titanium or tungsten containing liner (e.g., such as the layer 210 described above) the first deposition chamber may be configured to perform a chemical deposition process (e.g., such as chemical vapor deposition (CVD), metalorganic chemical vapor deposition (MOCVD), atomic layer deposition (ALD), plasma-enhanced chemical vapor deposition (PECVD), or the like). In such embodiments, the third deposition chamber may be configured to provide a process gas (e.g., a titanium-or tungsten-containing gas such as titanium tetrachloride (TiCl$_4$)), a titanium or tungsten containing metalorganic precursor, or the like, to facilitate deposition of the titanium or tungsten containing liner.

In some embodiments, a fourth deposition chamber (e.g., process chamber 138) may be configured to perform a deposition process to deposit the fourth layer (e.g., layer 212) described above. In such embodiments, the fourth deposition chamber may be configured to perform any type of deposition process suitable to deposit the particular material being deposited. For example, in embodiments where the fourth deposition chamber is configured to deposit a metal, for example, such as aluminum (Al), copper (Cu), or the like, to fill a feature of a substrate (e.g., feature 204 of substrate 202 described above), the fourth deposition chamber may be configured to perform an electroplating process.

In some embodiments, the factory interface 162 comprises at least one docking station 183 and at least one factory interface robot (one factory interface robot 185 shown) to facilitate transfer of substrates from the factory interface 162 to the processing platform 160 for processing through the load lock chambers 102, 104. The docking station 183 is configured to accept one or more (four shown) front opening unified pods (FOUPs) 187A-D. Optionally, one or more metrology stations (not shown) may be coupled to the factory interface 162 to facilitate measurement of the substrate from the FOUPs 187A-D. In some embodiments, the factory interface robot 185 disposed in the factory interface 162 is capable of linear and rotational movement (arrows 182) to shuttle cassettes of substrates between the load lock chambers 184 and a plurality of FOUPs 187A-D.

A controller 150 may be provided and coupled to the integrated platform 100 for controlling the components of the system. The controller 150 may be any suitable controller for a controlling the operation of a substrate process chamber or cluster tool. The controller 150 generally includes a central processing unit (CPU) 152, a memory 154, and support circuits 156. The CPU 152 may be any form of a general purpose computer processor that can be used in an industrial setting. The support circuits 156 are coupled to the CPU 152 and may comprise cache, clock circuits, input/output subsystems, power supplies, and the like. Software routines may be stored in the memory 154 of the controller 150. The software routines, when executed by the CPU 152, transform the CPU 152 into a specific purpose computer (controller) 150. The software routines may also be stored and/or executed by a second controller (not shown) that is located remotely from the controller 150. Alternatively or in combination, each process chamber of the integrated platform 100 may have its own controller for controlling portions of the methods disclosed herein that may be performed in that particular process chamber. In such embodiments, the individual controllers may be configured similar to the controller 150 and may be coupled to the controller 150 to synchronize operation of the integrated platform 100.

In an exemplary configuration of the integrated platform 100 described above, the integrated platform 100 comprises a first deposition chamber (e.g., process chamber 132) configured to deposit a titanium (Ti) or selenium (Se) containing layer, a second deposition chamber (e.g., process chamber 134) configured to deposit a (Ti) containing layer and a third deposition chamber (e.g., process chamber 136) configured to deposit a titanium nitride (TiN) or tungsten nitride (WN) layer and an optional fourth deposition chamber (e.g., process chamber 138) configured to deposit a metal layer. The integrated platform 100 may additionally include an optional degas and/or pre-clean chamber (e.g., process chamber 112), an optional oxidation chamber, for example, a rapid thermal process (RTP) (e.g., process chamber 112), and an optional anneal chamber, for example, a rapid thermal process (RTP) (e.g., process chamber 114).

When depositing a titanium (Ti) containing layer (e.g., as the layer 206), the first deposition chamber may be a via physical vapor deposition (PVD) chamber, RF deposition (e.g., plasma enhanced CVD (PECVD)) chamber, or atomic layer deposition (ALD) chamber. The titanium (Ti) containing layer may be deposited as a titanium oxide ($TiO_2$) layer in the RF deposition chamber or ALD chamber, or alternatively, may be deposited as a titanium layer (Ti) in the RF deposition chamber, ALD chamber or PVD chamber, and subsequently oxidized to form a titanium oxide ($TiO_2$) layer. When oxidized, the titanium layer (Ti) may be oxidized in the optional degas and/or pre-clean chamber, a pass-through chamber (e.g., pass-through chambers 122, 124), or the optional oxidation chamber (e.g., the rapid thermal process (RTP) chamber).

When depositing a selenium (Se) containing layer (e.g., as the layer 206), the first deposition chamber may be a chemical vapor deposition (CVD) chamber or an atomic layer deposition (ALD) chamber. The deposited selenium (Se) containing layer may be subsequently annealed in the CVD or ALD chamber utilized to deposit the selenium (Se) containing layer (e.g., the first deposition chamber), or alternatively, annealed in the optional degas and/or pre-clean chamber (e.g., process chamber 112) or the optional anneal chamber (e.g., the rapid thermal process (RTP) chamber).

The second deposition chamber may be a RF deposition (e.g., plasma enhanced CVD (PECVD) or physical vapor deposition (PVD)) chamber. The third deposition chamber may be a chemical vapor deposition (CVD) chamber, metalorganic chemical vapor deposition (MOCVD) chamber, atomic layer deposition (ALD) chamber or a plasma-enhanced chemical vapor deposition (PECVD) chamber. The optional fourth deposition chamber may be a electroplating chamber to deposit a metal fill, for example, such as aluminum (Al), copper (Cu), or the like.

Figure 3:
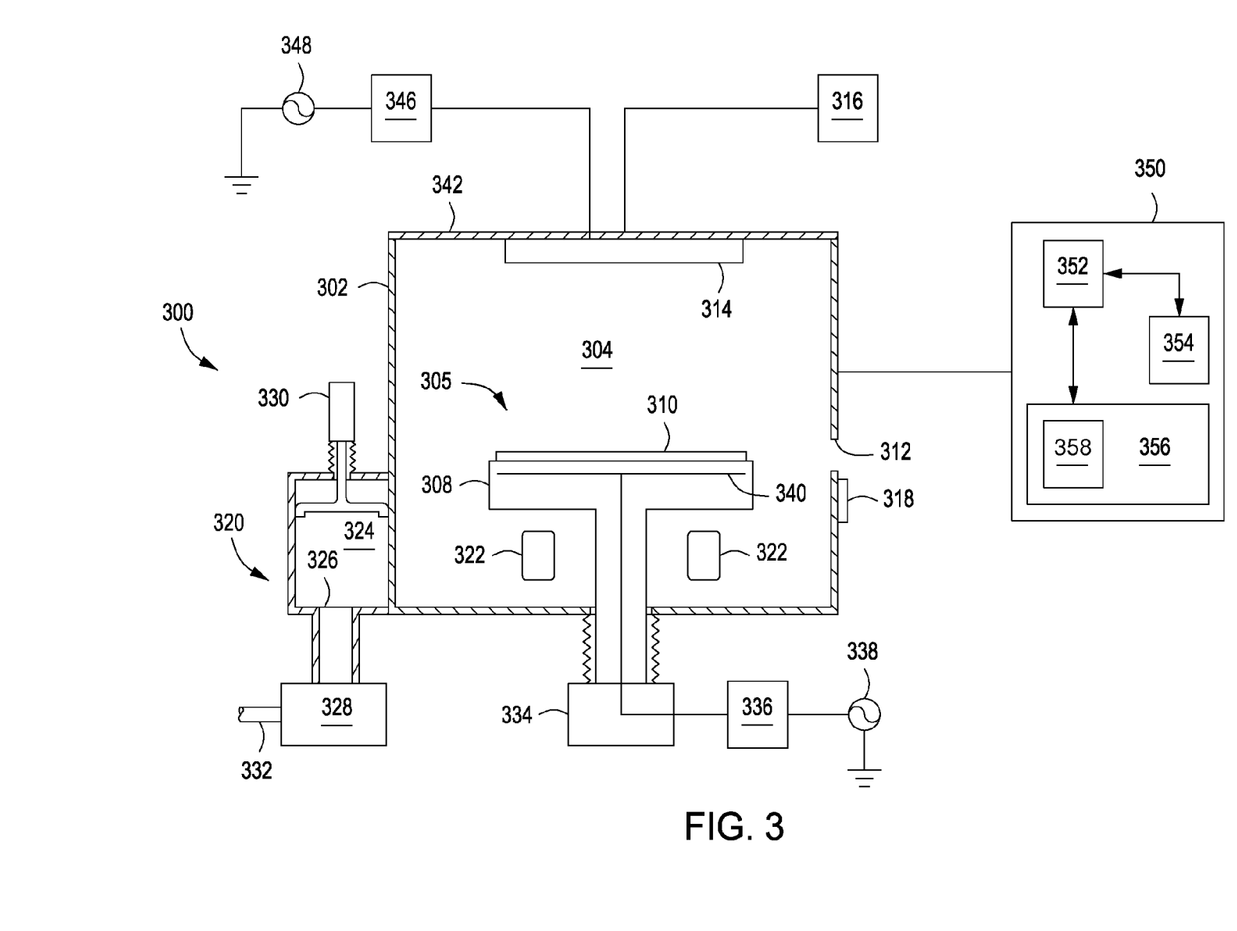
FIG. 3 depicts a process chamber suitable for use in an integrated platform in accordance with some embodiments of the present disclosure.

FIG. 3 depicts a process chamber suitable for use in an integrated platform in accordance with some embodiments of the present disclosure. In some embodiments, the process chamber 300 depicted in FIG. 3 may be utilized to deposit one or more layers of an NMOS device (e.g., layers 206, 208, 210, 212 of NMOS device 200 described above) or perform a pre-cleaning process or annealing process (e.g., the pre-cleaning process or annealing process described above). For example, the process chamber 300 may be configured to perform deposition processed such as CVD, PECVD, MOCVD, ALD, or the like.

In some embodiments, the process chamber 300 may generally comprise a chamber body 302 defining an inner volume 305, an exhaust system 320 for removing excess process gases, processing by-products, or the like, from the inner volume 305 and a controller 350 for controlling operation of the process chamber 300. Exemplary process chambers that may be configured as described herein may include the TxZ® or other process chambers, available from Applied Materials, Inc. of Santa Clara, Calif. Other suitable process chambers may similarly be used.

In some embodiments, the inner volume 305 includes a processing volume 304 that may be defined, for example, between a substrate support pedestal 308 disposed within the chamber body 302 for supporting a substrate 310 thereupon during processing and one or more gas inlets, such as a showerhead 314 and/or nozzles provided at desired locations. In some embodiments, the substrate support pedestal 308 may include a mechanism that retains or supports the substrate 310 on the surface of the substrate support pedestal 308, such as an electrostatic chuck, a vacuum chuck, a substrate retaining clamp, or the like (not shown). In some embodiments, the substrate support pedestal 308 may include mechanisms for controlling the substrate temperature (such as heating and/or cooling devices, not shown) and/or for controlling the species flux and/or ion energy proximate the substrate surface.

For example, in some embodiments, the substrate support pedestal 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 12,000 W at a frequency of about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. In some embodiments, three bias power sources may be provided for coupling RF power through respective matching networks to the RF bias electrode 340 at respective frequencies of about 2 MHz, about 13.56 MHz, and about 60 Mhz. The at least one bias power source may provide either continuous or pulsed power. In some embodiments, the bias power source alternatively may be a DC or pulsed DC source.

The substrate 310 may enter the process chamber 300 via an opening 312 in a wall of the chamber body 302. The opening 312 may be selectively sealed via a slit valve 318, or other mechanism for selectively providing access to the interior of the chamber through the opening 312. The substrate support pedestal 308 may be coupled to a lift mechanism 334 that may control the position of the substrate support pedestal 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support pedestal 308 may be disposed above the opening 312 to provide a symmetrical processing region.

The one or more gas inlets (e.g., the showerhead 314) may be coupled to a gas and/or plasma supply 316 for providing one or more process gases and/or plasma into the processing volume 304 of the chamber body 302. Although a showerhead 314 is shown in FIG. 3, additional or alternative gas inlets may be provided such as nozzles or inlets disposed in the ceiling or on the sidewalls of the chamber body 302 or at other locations suitable for providing gases as desired to the chamber body 302, such as the base of the process chamber, the periphery of the substrate support pedestal, or the like.

In some embodiments, the process chamber 300 may utilize capacitively coupled RF power for plasma processing, although the apparatus may also or alternatively use inductive coupling of RF power for plasma processing. For example, the chamber body 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 5,000 W at a frequency of about 2 MHz and or about 13.56 MHz or high frequency, such as 27 MHz and/or 60 MHz.

The exhaust system 320 generally includes a pumping plenum 324 and one or more conduits that couple the pumping plenum 324 to the inner volume 305 (and generally, the processing volume 304) of the process chamber 300, for example via one or more inlets 322 (two inlets shown in FIG. 3). A vacuum pump 328 may be coupled to the pumping plenum 324 via a pumping port 326 for pumping out the exhaust gases from the process chamber 300. The vacuum pump 328 may be fluidly coupled to an exhaust outlet 332 for routing the exhaust as required to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be one of any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The methods disclosed herein may generally be stored in the memory 356 as a software routine 358 that, when executed by the CPU 352, causes the process chamber 300 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, embodiments of the present disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support pedestal 308. The software routine 358, when executed by the CPU 352, transforms the general purpose computer into a specific purpose computer (controller) 350 that controls the chamber operation such that the methods disclosed herein are performed.

Figure 4:
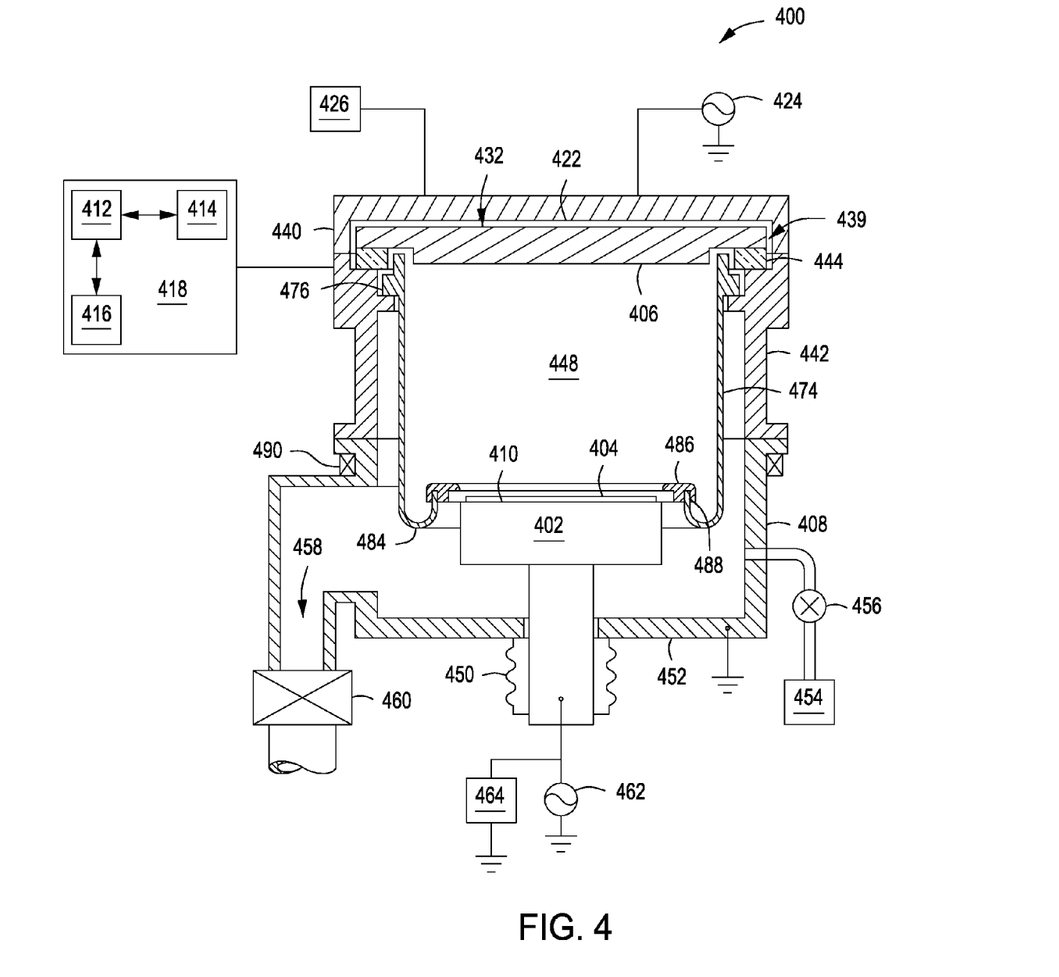
FIG. 4 depicts a process chamber suitable for use in an integrated platform in accordance with some embodiments of the present disclosure.

FIG. 4 depicts a physical vapor deposition (PVD) process chamber suitable for use in an integrated platform in accordance with some embodiments of the present disclosure. In some embodiments, the process chamber 400 depicted in FIG. 4 may be utilized to deposit one or more layers of an NMOS device (e.g., layers 206, 208, 210, 212 of NMOS device 200 described above). Examples of suitable process chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive method disclosed herein.

In some embodiments, the process chamber 400 generally includes a substrate support pedestal 402 for receiving a substrate 404 thereon, and a sputtering source, such as a target 406. The substrate support pedestal 402 may be located within a grounded enclosure wall (e.g., the chamber wall 408), which may be a chamber wall (as shown) or a grounded shield (a ground shield 440 is shown covering at least some portions of the process chamber 400 above the target 406). In some embodiments, the ground shield 440 could be extended below the target to enclose the pedestal 402 as well.

In some embodiments, the target 406 may be coupled to source distribution plate 422. The source distribution plate 422 may be fabricated from suitable conductive materials to conduct power from one or more power sources to the target 406. Any number of power sources may be utilized to provide power to the target 406 to accommodate for a particular application or process performed in the process chamber 400. For example, in some embodiments, a DC power source 426 and RF power source 424 may provide DC power and RF power, respectively, to the target 406 via the source distribution plate 422. In such embodiments, the DC power source 426 may be utilized to apply a negative voltage, or bias, to the target 406. In some embodiments, RF energy supplied by the RF power source 424 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

The ground shield 440 may be provided to cover the outside surfaces of the lid of the process chamber 400. The ground shield 440 may be coupled to ground, for example, via the ground connection of the chamber body. The ground shield 440 may comprise any suitable conductive material, such as aluminum, copper, or the like. In some embodiments, an insulative gap 439 is provided between the ground shield 440 and the outer surfaces of the source distribution plate 422, and the target 406 to prevent the RF and DC energy from being routed directly to ground. The insulative gap may be filled with air or some other suitable dielectric material, such as a ceramic, a plastic, or the like.

The target 406 may be supported on a grounded conductive aluminum adapter (e.g., adapter 442) through a dielectric isolator 444. The target 406 comprises a material to be deposited on the substrate 404 during sputtering, such a metal or metal oxide. In some embodiments, a backing plate (not shown) may be coupled to the source distribution plate-facing surface 432 of the target 406. The backing plate may comprise a conductive material, such as copper-zinc, copper-chrome, or the same material as the target, such that RF and DC power can be coupled to the target 406 via the backing plate. Alternatively, the backing plate may be non-conductive and may include conductive elements (not shown) such as electrical feedthroughs or the like for coupling RF and DC power to the target 406.

The substrate support pedestal 402 has a substrate support surface 410 facing the principal surface of the target 406 and supports the substrate 404 to be processed. The substrate support pedestal 402 may support the substrate 404 in a processing volume 448 of the process chamber 400. The processing volume 448 is defined as the region above the substrate support pedestal 402 during processing (for example, between the target 406 and the substrate support pedestal 402 when in a processing position).

In some embodiments, the substrate support pedestal 402 may be vertically movable through a bellows 450 connected to a bottom chamber wall 452 to allow the substrate 404 to be transferred onto the substrate support pedestal 402 through a load lock valve (not shown) in the lower portion of the process chamber 400 and thereafter raised to one or more positions for processing (e.g., as described above).

One or more processing gases may be supplied from a gas source 454 through a mass flow controller 456 into the lower part of the process chamber 400. An exhaust port 458 may be provided and coupled to a pump (not shown) via a valve 460 for exhausting the interior of the process chamber 400 and facilitating maintaining a desired pressure inside the process chamber 400.

In some embodiments, one or more power sources (an RF power source 462 and DC power source 464 shown) may be coupled to the substrate support pedestal 402. When present, the RF power source 462 may be coupled to the substrate support pedestal 402 to induce a negative DC bias on the substrate 404. In addition, in some embodiments, a negative DC self-bias may form on the substrate 404 during processing.

In some embodiments, the process chamber 400 may further include a process kit shield 474 connected to a ledge 476 of the adapter 442. The adapter 442 in turn is sealed and grounded to the chamber wall 408. Generally, the process kit shield 474 extends downwardly along the walls of the adapter 442 and the chamber wall 408 downwardly to below an upper surface of the substrate support pedestal 402 and returns upwardly until reaching an upper surface of the substrate support pedestal 402 (e.g., forming a u-shaped portion 484 at the bottom). Alternatively, the bottommost portion of the process kit shield need not be a u-shaped portion 484 and may have any suitable shape. A cover ring 486 rests on the top of an upwardly extending lip 488 of the process kit shield 474. An additional deposition ring (not shown) may be used to shield the periphery of the substrate 404 from deposition.

In some embodiments, a magnet 490 may be disposed about the process chamber 400 for selectively providing a magnetic field between the substrate support pedestal 402 and the target 406. For example, as shown in FIG. 4, the magnet 490 may be disposed about the outside of the chamber wall 408 in a region just above the substrate support pedestal 402. In some embodiments, the magnet 490 may be disposed additionally or alternatively in other locations, such as adjacent the adapter 442. The magnet 490 may be an electromagnet and may be coupled to a power source (not shown) for controlling the magnitude of the magnetic field generated by the electromagnet.

A controller 418 may be provided and coupled to various components of the process chamber 400 to control the operation thereof. The controller 418 includes a central processing unit (CPU) 412, a memory 414, and support circuits 416. The controller 418 may control the process chamber 400 directly, or via computers (or controllers) associated with particular process chamber and/or support system components. The controller 418 may be one of any form of general-purpose computer processor that can be used in an industrial setting for controlling various chambers and sub-processors. The memory, or computer readable medium, 414 of the controller 418 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 416 are coupled to the CPU 412 for supporting the processor in a conventional manner. These circuits include cache, power supplies, clock circuits, input/output circuitry and subsystems, and the like. The methods as described herein may be stored in the memory 414 as software routine that may be executed or invoked to control the operation of the process chamber 400 in the manner described herein. The software routine may also be stored and/or executed by a second CPU (not shown) that is remotely located from the hardware being controlled by the CPU 412.

Thus, embodiments of an integrated platform for fabricating n-type metal oxide semiconductor devices are provided herein. In at least some embodiments, the inventive integrated device may advantageously thereby provide an increased level of control over the fabrication environment, as compared to fabricating the NMOS device in separate standalone process chambers.

While the foregoing is directed to the illustrative embodiment of the present disclosure, other and further embodiments of the disclosure may be devised without departing from the basic scope thereof.

The invention claimed is:

1. An integrated platform for fabricating n-type metal oxide semiconductor (NMOS) devices, comprising:
    a first deposition chamber configured to deposit a first layer atop a substrate, the first layer comprising titanium oxide ($TiO_2$) or selenium (Se);
    a second deposition chamber configured to deposit a second layer atop the first layer, the second layer comprising titanium; and
    a third deposition chamber configured to deposit a third layer atop the second layer, the third layer comprising one of titanium nitride (TiN) or tungsten nitride (WN).

2. The integrated platform of claim 1, further comprising:
    a fourth deposition chamber configured to perform an electroplating process to deposit a fourth layer atop the third layer, the fourth layer comprising a metal.

3. The integrated platform of claim 1, further comprising:
    a process chamber configured to anneal the first layer when the first layer comprises selenium (Se).

4. The integrated platform of claim 3, wherein the process chamber is the first deposition chamber or the second deposition chamber.

5. The integrated platform of claim 1, further comprising:
    a pre-clean chamber configured to perform a pre-cleaning process on a substrate.

6. The integrated platform of claim 5, wherein the pre-clean chamber is configured to provide a remotely formed first plasma to the substrate.

7. The integrated platform of claim 6, wherein the first plasma comprises hydrogen ($H_2$), nitrogen trifluoride ($NF_3$), and ammonia ($NH_3$).

8. The integrated platform of claim 5, wherein the pre-clean chamber is configured to provide a remotely formed second plasma to the substrate.

9. The integrated platform of claim 8, wherein the second plasma comprises plasma comprises hydrogen ($H_2$) or oxygen ($O_2$).

10. The integrated platform of claim 1, wherein the first deposition chamber is configured to perform one of a physical vapor deposition (PVD), a chemical vapor deposition (CVD), or an atomic layer deposition (ALD) process.

11. The integrated platform of claim 1, wherein the second deposition chamber is configured to perform a physical vapor deposition (PVD) process.

12. The integrated platform of claim 1, wherein the third deposition chamber is configured to perform an atomic layer deposition (ALD) process.

13. The integrated platform of claim 1, further comprising:
a transfer chamber having a substrate transfer robot disposed within the transfer chamber, the transfer chamber coupled to the first deposition chamber, the second deposition chamber and the third deposition chamber; and
a load-lock chamber coupled to the transfer chamber.

14. The integrated platform of claim 13, further comprising:
a factory interface having a substrate transfer robot disposed within the factory interface, the factory interface coupled to the transfer chamber to provide the substrate to the integrated platform.

15. An integrated platform for fabricating n-type metal oxide semiconductor (NMOS) devices, comprising:
a transfer chamber having a substrate transfer robot disposed within the transfer chamber, the transfer chamber having a plurality of process chambers coupled to the transfer chamber, the plurality of process chambers comprising;
a first deposition chamber configured to deposit a first layer atop the substrate, the first layer comprising titanium oxide ($TiO_2$) or selenium (Se);
a second deposition chamber configured to deposit a second layer atop the first layer, the second layer comprising titanium;
a third deposition chamber configured to deposit a third layer atop the second layer, the third layer comprising one of titanium nitride (TiN) or tungsten nitride (WN);
a load-lock chamber coupled to the transfer chamber; and
a factory interface having a substrate transfer robot disposed within the factory interface, the factory interface coupled to the transfer chamber to provide the substrate to the integrated platform.

16. The integrated platform of claim 15, further comprising:
a process chamber configured to anneal the first layer when the first layer comprises selenium (Se).

17. The integrated platform of claim 15, wherein the first deposition chamber is configured to perform one of physical vapor deposition (PVD), chemical vapor deposition (CVD) or atomic layer deposition (ALD) process.

18. The integrated platform of claim 15, wherein the second deposition chamber is configured to perform a physical vapor deposition (PVD) process.

19. The integrated platform of claim 15, wherein the third deposition chamber is configured to perform an atomic layer deposition (ALD) process.

20. A method for fabricating n-type metal oxide semiconductor (NMOS) devices in an integrated platform, comprising:
depositing, in a first deposition chamber of the integrated platform, a first layer on a top processing surface of a substrate, the first layer comprising titanium oxide ($TiO_2$) or selenium (Se);
depositing, in a second deposition chamber of the integrated platform, a second layer atop the first layer, the second layer comprising titanium; and
depositing, in a third deposition chamber of the integrated platform, a third layer atop the second layer, the third layer comprising one of titanium nitride (TiN) or tungsten nitride (WN).

* * * * *